US 12,422,162 B2

(12) United States Patent
Jeon et al.

(10) Patent No.: US 12,422,162 B2
(45) Date of Patent: Sep. 23, 2025

(54) COOLING METHOD AND APPARATUS USING INTERNAL CIRCULATION AIR FLOW

(71) Applicant: YC Corporation, Seongnam-si (KR)

(72) Inventors: Dong Je Jeon, Cheonan-si (KR); Kwang Hwa Lee, Suwon-si (KR)

(73) Assignee: YC Corporation, Gyeonggi-Do (KR)

( * ) Notice: Subject to any disclaimer, the term of this patent is extended or adjusted under 35 U.S.C. 154(b) by 191 days.

(21) Appl. No.: 18/331,382

(22) Filed: Jun. 8, 2023

(65) Prior Publication Data

US 2024/0027092 A1    Jan. 25, 2024

(30) Foreign Application Priority Data

Jul. 19, 2022    (KR) .................. 10-2022-0088838

(51) Int. Cl.
*F24F 11/79*     (2018.01)
*F24F 13/10*     (2006.01)
*F24F 110/10*    (2018.01)

(52) U.S. Cl.
CPC .............. *F24F 11/79* (2018.01); *F24F 13/10* (2013.01); *F24F 2110/10* (2018.01)

(58) Field of Classification Search
CPC ........ F24F 11/79; F24F 13/10; F24F 2110/10; H01L 21/67248; H05K 7/20172; H05K 7/20181; H05K 7/20209
See application file for complete search history.

(56) References Cited

U.S. PATENT DOCUMENTS

| | | | | |
|---|---|---|---|---|
| 9,338,923 | B2* | 5/2016 | Lee | G06F 1/203 |
| 11,285,418 | B2* | 3/2022 | Akasaka | A61L 9/16 |
| 2012/0255721 | A1* | 10/2012 | Kim | G09F 19/22 |
| | | | | 362/97.1 |
| 2015/0270587 | A1* | 9/2015 | Cho | H01M 10/482 |
| | | | | 429/62 |
| 2020/0315070 | A1* | 10/2020 | Holland | F04D 25/166 |
| 2021/0092798 | A1* | 3/2021 | Nabeta | B05C 11/1015 |

FOREIGN PATENT DOCUMENTS

| | | |
|---|---|---|
| JP | H06-090092 A | 3/1994 |
| KR | 10-2022-0086183 A | 6/2022 |
| WO | WO-2017-154060 A1 | 9/2017 |

OTHER PUBLICATIONS

Office Action for Korean Application No. 10-2022-0088838 dated Feb. 23, 2023.

* cited by examiner

*Primary Examiner* — Lionel Nouketcha
(74) *Attorney, Agent, or Firm* — Harness, Dickey & Pierce, P.L.C.

(57) ABSTRACT

An apparatus is provided. The apparatus includes: a first substrate including first cooling means using a refrigerant that is circulated with the outside; a second substrate disposed to be in parallel with, and apart from, the first substrate and thus to form first heat accumulation space between the first and second substrates, the second substrate including second cooling means using a refrigerant that is circulated with the outside; a first fan generating a first air flow in the first heat accumulation space in a direction parallel to the first and second substrates; and a housing of a closed structure.

14 Claims, 12 Drawing Sheets

COOLING METHOD AND APPARATUS USING INTERNAL CIRCULATION AIR FLOW

CROSS-REFERENCE TO RELATED APPLICATION

This application claims priority from Korean Patent Application No. 10-2022-0088838 filed on Jul. 19, 2022 in the Korean Intellectual Property Office, and all the benefits accruing therefrom under 35 U.S.C. 119, the contents of which in its entirety are herein incorporated by reference.

BACKGROUND

1. Field

The present disclosure relates to a cooling method and apparatus using an internal circulation air flow, and more particularly, to a cooling method and apparatus for efficiently cooling multiple devices mounted on a substrate.

2. Description of the Related Art

There is provided an apparatus for assisting with the cooling of multiple devices mounted on each of a plurality of substrates by generating air flows in heat accumulation space formed between the substrates, particularly, an apparatus for improving the efficiency of cooling the devices by controlling the air flow generated in the heat accumulation space to circulate inside the devices.

Heat generated from the devices mounted on each of the substrates may accumulate in the space between the substrates. However, the accumulated heat may affect the devices and may thus lower the efficiency of cooling the devices.

Accordingly, a technique is needed to efficiently cool the devices by preventing accumulation of heat released from the devices, in the space between the substrates with the use of an air flow circulating inside the devices.

SUMMARY

Aspects of the present disclosure provide an apparatus capable of preventing accumulation of heat by generating an air flow in space between substrates.

Aspects of the present disclosure also provide an apparatus capable of improving cooling efficiency by making an air flow generated in space between substrates circulate inside devices mounted on each of the substrates.

Aspects of the present disclosure also provide an apparatus capable of generating an optimal air flow for the cooling of devices mounted on each substate by automatically controlling the angle of fans to control the direction of the air flow.

Aspects of the present disclosure also provide an apparatus capable of generating an optimal air flow for the cooling of devices mounted on each substate by automatically controlling the speed of fans to control the intensity of the air flow.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, an apparatus may include: a first substrate including first cooling means using a refrigerant that is circulated with the outside; a second substrate disposed to be in parallel with, and apart from, the first substrate and thus to form first heat accumulation space between the first and second substrates, the second substrate including second cooling means using a refrigerant that is circulated with the outside; a first fan generating a first air flow in the first heat accumulation space in a direction parallel to the first and second substrates; and a housing of a closed structure.

In some embodiments, the apparatus may further include: a temperature sensor measuring the temperature in the apparatus at intervals of a predetermined amount of time; and a first air flow controller automatically controlling an angle of the first fan if the temperature measured by the temperature sensor is not within a predefined valid temperature range.

In some embodiments, the first air flow controller may include a first fan tilt control motor, which provides power for primarily controlling the angle of the first fan, and a first air flap, which is disposed between the first fan and the first heat accumulation space and secondarily controls the first air flow generated by the first fan.

In some embodiments, the apparatus may further include: a third substrate arranged to be in parallel with, and apart from, the second substrate and thus to form second heat accumulation space between the second and third substrates, the third substrate including third cooling means using a refrigerant that is circulated with the outside, wherein a number of devices positioned in the first heat accumulation space is greater than a number of devices positioned in the second heat accumulation space.

In some embodiments, the apparatus may further include: a third substrate arranged to be in parallel with, and apart from, the second substrate and thus to form second heat accumulation space between the second and third substrates, the third substrate including third cooling means using a refrigerant that is circulated with the outside; a first temperature sensor measuring the temperature of the first heat accumulation space; and a second temperature sensor measuring the temperature of the second heat accumulation space, wherein the temperature measured by the first temperature is higher than the temperature measured by the second temperature sensor.

In some embodiments, the apparatus may further include: a third substrate arranged to be in parallel with, and apart from, the second substrate and thus to form second heat accumulation space between the second and third substrates, the third substrate including third cooling means using a refrigerant that is circulated with the outside; and a second fan generating a second air flow in the second heat accumulation space in a direction parallel to the second and third substrates and in an opposite direction to that of the first air flow.

In some embodiments, the apparatus may further include: a temperature sensor measuring the temperature in the apparatus at intervals of a predetermined amount of time; a first air flow controller automatically controlling an angle of the first fan if the temperature measured by the temperature sensor is not within a predefined valid temperature range; and a second air flow controller automatically controlling an angle of the second fan.

In some embodiments, the first air flow controller may include a first fan tilt control motor, which provides power for primarily controlling the angle of the first fan, and a first air flap, which is disposed between the first fan and the first heat accumulation space and secondarily controls the first air flow generated by the first fan, and the second air flow controller may include a second fan tilt control motor, which provides power for primarily controlling the angle of the second fan, and a second air flap, which is disposed between the second fan and the second heat accumulation space and secondarily controls the second air flow generated by the second fan.

In some embodiments, the apparatus may comprise a test head of a wafer test apparatus.

According to another aspect of the present disclosure, a cooling method using an internal circulation air flow, which is performed by an apparatus including substrates, fans, and a housing of a closed structure, may include: providing, by a first substrate, first cooling means using a refrigerant that is circulated with the outside; forming first heat accumulation space between the first substrate and a second substrate, which is disposed to be in parallel with, and apart from, the first substrate, and providing, by the second substrate, second cooling means using a refrigerant that is circulated with the outside; and generating, by a first fan, a first air flow in the first heat accumulation space in a direction parallel to the first and second substrates.

In some embodiments, the cooling method may further include: measuring, by a temperature sensor, the temperature in the apparatus at intervals of a predetermined amount of time; and automatically controlling, by a first air flow controller, an angle of the first fan if the temperature measured by the temperature sensor is not within a predefined valid temperature range.

In some embodiments, the first air flow controller may include a first fan tilt control motor, which provides power for primarily controlling the angle of the first fan, and a first air flap, which is disposed between the first fan and the first heat accumulation space and secondarily controls the first air flow generated by the first fan.

In some embodiments, the cooling method may further include: forming second heat accumulation space between the second substrate and a third substrate, which is disposed to be in parallel with, and apart from, the second substrate, and providing, by the third substrate, third cooling means using a refrigerant that is circulated with the outside, wherein a number of devices positioned in the first heat accumulation space is greater than a number of devices positioned in the second heat accumulation space.

In some embodiments, the forming the second heat accumulation space and the providing the third cooling means, may include measuring, by a first temperature sensor, the temperature of the first heat accumulation space and measuring, by a second temperature sensor, the temperature of the second heat accumulation space, and the temperature measured by the first temperature sensor may be higher than the temperature measured by the second temperature sensor.

In some embodiments, the forming the second heat accumulation space and the providing the third cooling means, may include generating, by a second fan, a second air flow in a direction parallel to the second and third substrates and in an opposite direction to that of the first air flow.

In some embodiments, the cooling method may further include: measuring, by a temperature sensor, the temperature in the apparatus at intervals of a predetermined amount of time; automatically controlling, by a first air flow controller, an angle of the first fan if the temperature measured by the temperature sensor is not within a predefined valid temperature range; and automatically controlling, by a second air flow controller, an angle of the second fan.

In some embodiments, the first air flow controller may include a first fan tilt control motor, which provides power for primarily controlling the angle of the first fan, and a first air flap, which is disposed between the first fan and the first heat accumulation space and secondarily controls the first air flow generated by the first fan, and the second air flow controller may include a second fan tilt control motor, which provides power for primarily controlling the angle of the second fan, and a second air flap, which is disposed between the second fan and the second heat accumulation space and secondarily controls the second air flow generated by the second fan.

In some embodiments, apparatus may comprise a test head of a wafer test apparatus.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Embodiments of the present disclosure will hereinafter be described in detail with reference to the accompanying drawings. Advantages and features of the present disclosure, and methods for achieving them, will be made clear from embodiments described below in detail with reference to the accompanying drawings. The present disclosure may, however, be embodied in many different forms, and should not be construed as being limited to the embodiments set forth herein. Rather, these embodiments are provided so that this disclosure will be thorough and complete, and will fully convey the scope of the disclosure to those skilled in the art. The present disclosure is defined only by the scope of the claims.

Descriptions of well-known features, elements, or functions that may obscure the subject matter of the present disclosure will be omitted.

The terms "first," "second," etc. may be used herein to describe and distinguish various elements, components, regions, layers, or sections, but do not imply a sequence or order unless clearly indicated by the context.

First, some terms used herein will be briefly defined.

The term "device" refers to nearly any type of device (such as a semiconductor chip, device, package, or part or element) that generates heat and is provided in an apparatus, cooling means may include a refrigerant, a heat sheet, devices, a substrate where the devices are mounted, and a cold plate in contact with the substrate, and the apparatus may include fans, air flaps, temperature sensors, and substrates each equipped with cooling means. That is, an apparatus is clearly distinguished from a device in that it includes various other elements than the device, and is also clearly distinguished from cooling means in that it includes various other elements than the cooling means.

Embodiments of the present disclosure will hereinafter be described with reference to the accompanying drawings.

Figure 1:
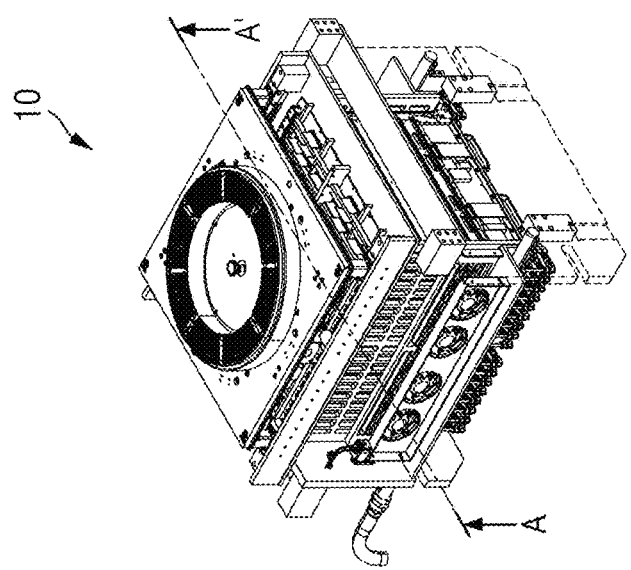
FIG. 1 shows three-dimensional (3D) images of an apparatus according to an embodiment of the present disclosure.
Figure 1:
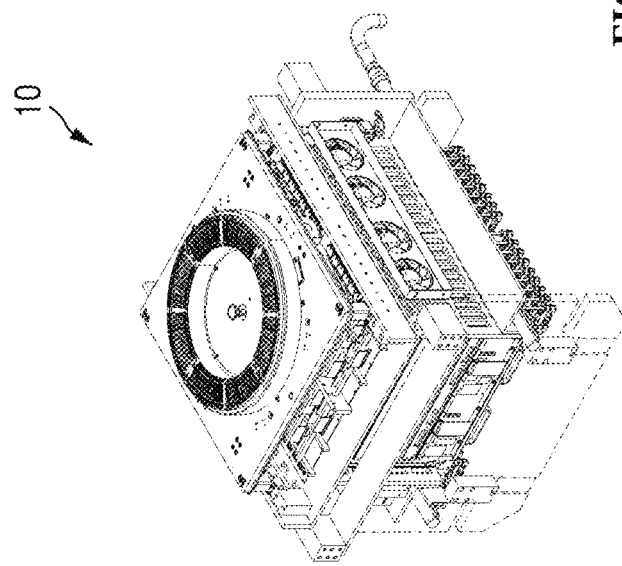

FIG. 1 shows three-dimensional (3D) images of an apparatus according to an embodiment of the present disclosure.

Referring to FIG. 1, an apparatus 10 may be a test head of a wafer test apparatus. The apparatus 10 may include substrates, on which multiple devices are mounted, fans, air flaps, and temperature sensors.

Figure 2:
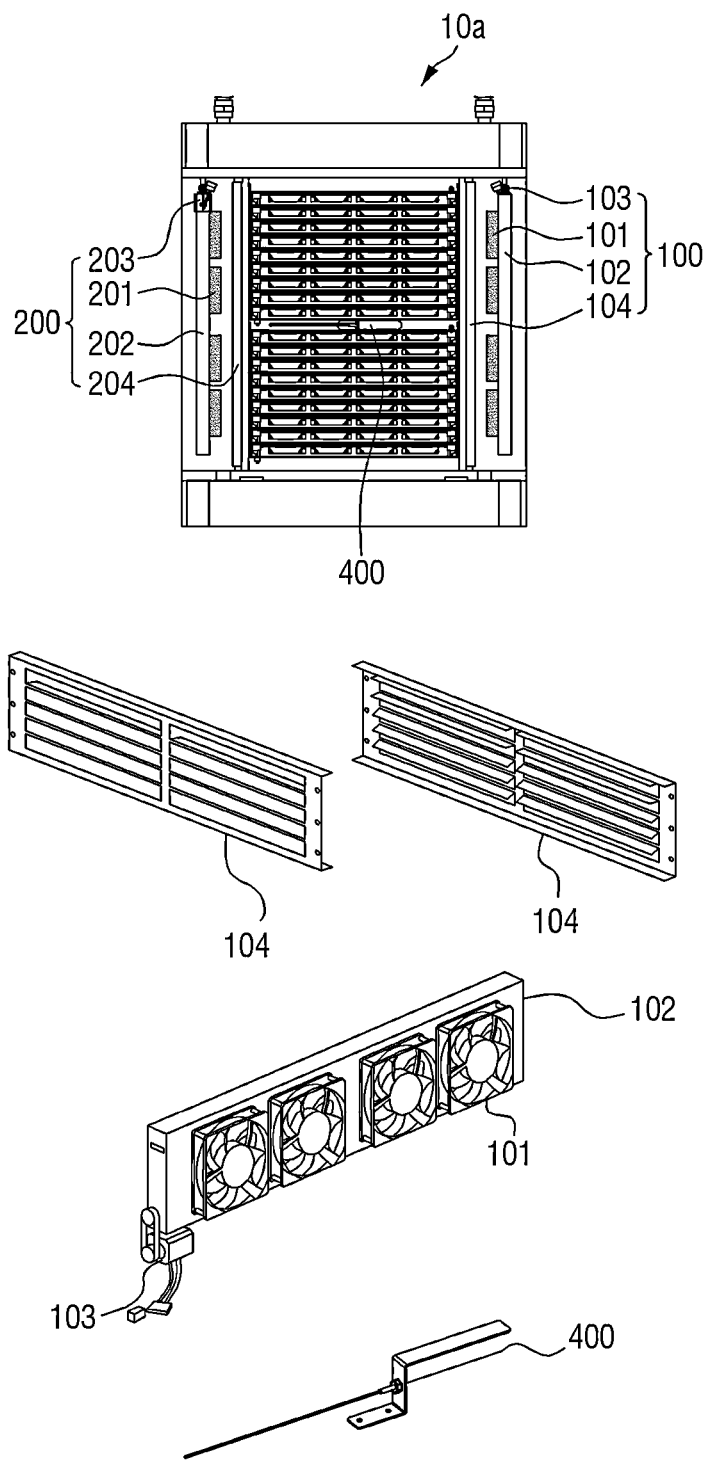
FIG. 2 illustrates a plan view and an exploded perspective view of the apparatus of FIG. 1.
Figure 3:
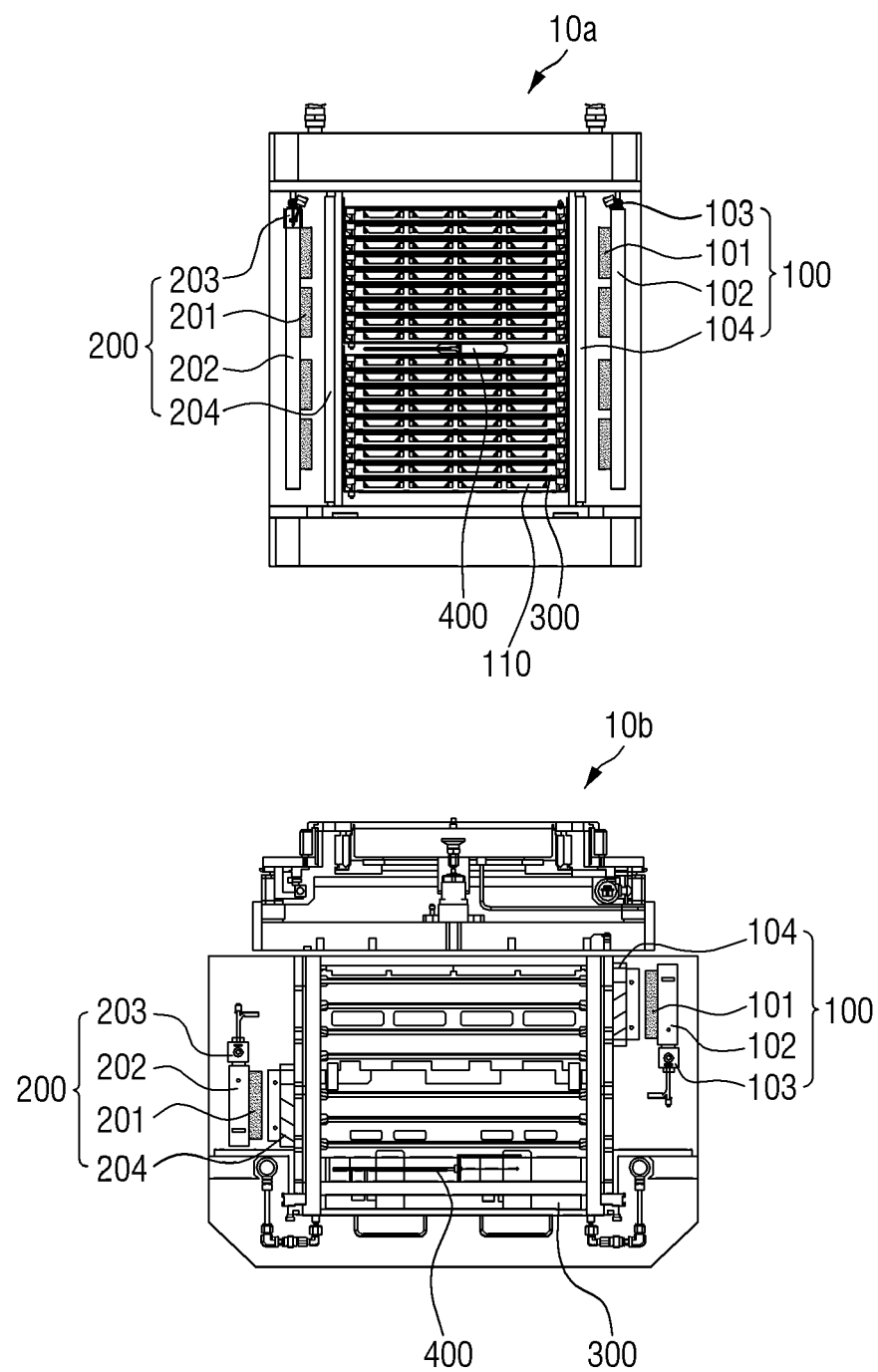
FIG. 3 illustrates a plan view and a cross-sectional view of air controllers of FIG. 1.

FIG. 2 illustrates a plan view 10a and an exploded perspective view of the apparatus of FIG. 1, and FIG. 3 illustrates a plan view 10a and a cross-sectional view 10b, taken along line A-A' of FIG. 1, of the apparatus of FIG. 1.

Referring to FIG. 2, the apparatus may include substrates 300, devices 110, which are mounted on each of the substrates 300, and first and second air flow controllers 100 and 200, which assist with the cooling of the devices 110. The devices 110 may be heating elements, and in order to cool the devices 110, the substrate 300 may be provided with cooling means using a refrigerant that can be circulated with the outside. The cooling means will be described later with reference to FIG. 5A.

The apparatus 10 may include a plurality of substrates 300, which are disposed to be spaced apart from one another. Space may be formed between the substrates 300, and heat released from the devices 110 may accumulate in the space. The first and second air flow controllers 100 and 200 may generate air flows in the space and may thus prevent accumulation of heat in the space and improve the efficiency of cooling the devices 110.

The first and second air flow controllers 100 and 200 may include first and second fans 101 and 201, respectively, first and second fan brackets 102 and 202, respectively, first and second fan tilt control motors 103 and 203, respectively, and first and second air flaps 104 and 204, respectively. The first fan 101, the first fan bracket 102, the first fan tilt control motor 103, and the first air flap 104 of the first air flow controller 100 will hereinafter be described with reference to FIG. 3.

FIG. 3 illustrates the structure of the first and second air flow controllers of the apparatus of FIGS. 1 and 2.

The first fan 101, the first fan bracket 102, the first fan tilt control motor 103, and the first air flap 104 may be included in the apparatus 10, as illustrated in FIG. 3, but the present disclosure is not limited thereto.

Referring to FIGS. 2 and 3, the first and second air flow controllers 100 and 200 may be disposed on left and right sides, respectively, of an array of substrates 300 to face each other. Accordingly, as the direction of an air flow generated by the first fan 101 differs from the direction of an air flow generated by the second fan 201, an air flow circulating in a closed internal space can be generated.

The first and second air flow controllers 100 and 200 may automatically control the direction and intensity of air flows based on the temperature measured by a temperature sensor 400. The temperature sensor 400 may be included in the apparatus 100, as illustrated in FIG. 3, but the present disclosure is not limited thereto. This will be described later with reference to FIGS. 4 and 10.

FIG. 2 illustrates that the apparatus 10 is a test head of a wafer test apparatus, but the present disclosure is not limited thereto. That is, the present disclosure may encompass various types of apparatuses equipped with a closed space therein.

Figure 4:
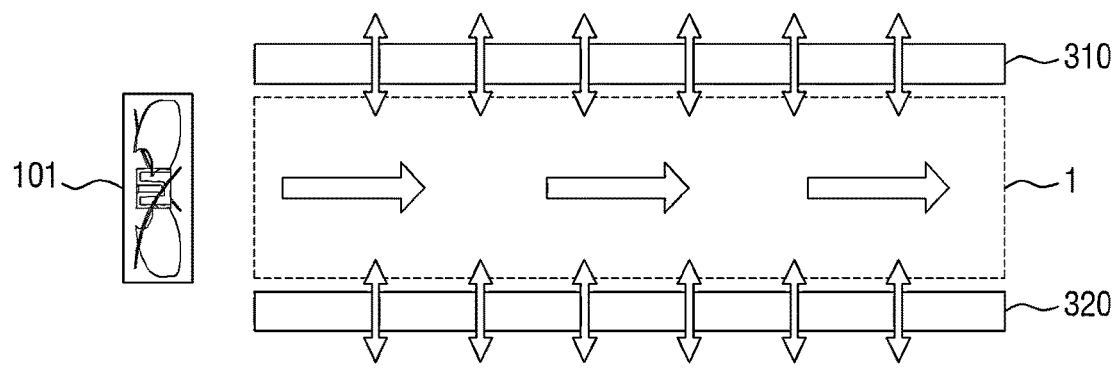
FIG. 4 is a schematic view illustrating how the apparatus of FIG. 1 generates an air flow in heat accumulation space between substrates using a fan.

FIG. 4 is a schematic view illustrating how to generate an air flow in heat accumulation space between substrates in the apparatus of FIG. 1. Although not specifically illustrated in FIG. 4, a plurality of devices may be mounted on each of first and second substrates 310 and 320. The devices may be heating elements and may be cooled by first and second cooling means.

Referring to FIG. 4, the first and second substrates 310 and 320 may be disposed to be spaced apart from each other and may be arranged in parallel with each other. The first and second substrates 310 and 320 may be arranged substantially in parallel with each other such that the first and second substrates 310 and 320 may form an angle less than a predefined reference level therebetween. Space where heat released from the devices mounted on each of the first and second substrates 310 and 320 accumulates will hereinafter be referred to as first heat accumulation space 1.

The first fan 101 may generate a first air flow in the first heat accumulation space 1 in a direction parallel to the first and second substrates 310 and 320. The direction of the first air flow may be substantially parallel to the first and second substrates 310 and 320 so that the angles between the first air flow and the first and second substrates 310 and 320 may be less the predefined reference level. Alternatively, the direction of the first air flow may be substantially parallel to the first and second substrates 310 and 320 so that the sum of the angles between the first air flow and the first and second substrates 310 and 320 may be less than the predefined reference level.

The first substrate 310 may be provided with first cooling means using a refrigerant that can be circulated with the outside, and the second substrate 310 may be provided with second cooling means using a refrigerant that can be circulated with the outside. Heat in the first heat accumulation space 1 may be released to the outside of the apparatus 10 by the refrigerants of the first and second cooling means. The first heat accumulation space 1 may be slightly distant from the first and second cooling means, but as the first air flow is generated, heated air in the first heat accumulation space 1 can be placed in contact with the first or second cooling means. Accordingly, the efficiency of cooling the devices mounted on each of the first and second substrates 310 and 320 can be improved.

In short, as an air flow is generated in the first heat accumulation space 1 via the first fan 101 for the devices that are being cooled by the first and second cooling means of the first and second substrates 310 and 320, accumulation of heat in the first heat accumulation space 1 can be prevented, and the efficiency of cooling the devices mounted on each of the first and second substrates 310 and 320 can be improved.

Although not specifically illustrated in FIG. 4, the apparatus 10 may include a housing of a closed structure. The housing may prevent heat on the inside of the apparatus 10 from being released out of the apparatus 10.

Also, although not specifically illustrated in FIG. 4, the apparatus 10 may further include the temperature sensor 400, which measures the temperature inside the apparatus 10 at intervals of a predetermined amount of time, and the first air flow controller 100, which automatically controls the angle of the first fan 101 if a temperature measurement provided by the temperature sensor 400 is not within a valid temperature range determined in advance.

The first air flow controller 100 may include the first fan tilt control motor 103, which provides power for primarily controlling the angle of the first fan 101, and the first air flap 104, which is disposed between the first fan 101 and the first heat accumulation space 1 and secondarily controls the first air flow generated by the first fan 101.

In other words, the temperature in the apparatus 10 may be measured by the temperature sensor 400, and if the measured temperature is not within the valid temperature range, the first air flow controller 100 may improve cooling efficiency by automatically controlling the angle of the first fan 101 such that the temperature in the apparatus 10 falls within the valid temperature range. The greater the difference between the measured temperature and the valid temperature range, the greater the amount by which the first air flow controller 100 controls the angle of the first fan 101.

Specifically, the direction of an air flow generated in the first heat accumulation space 1 may be controlled by primarily controlling the angle of the first fan 101 with power provided by the first fan tilt control motor 103 and secondarily controlling the installation angle of the first air flap 104 with another power. However, it is not particularly limited by which element of the apparatus 10, or in what order, the direction of an air flow can be controlled. That is, the first air flow controller 100 may control the direction of an air flow only using the first fan tilt control motor 103 or using both the first fan tilt control motor 103 and the first air flap 104.

The first air flow controller 100 may control not only the direction of an air flow, but also the intensity of an air flow. For example, if the temperature in the apparatus 10, measured by the temperature sensor 400, exceeds the maximum of the valid temperature range, the first air flow controller 100 may reduce the speed of the first fan 101, and if the temperature in the apparatus 10, measured by the temperature sensor 400, is less than the minimum of the valid temperature range, the first air flow controller 100 may increase the speed of the first fan 101.

Figure 5A:
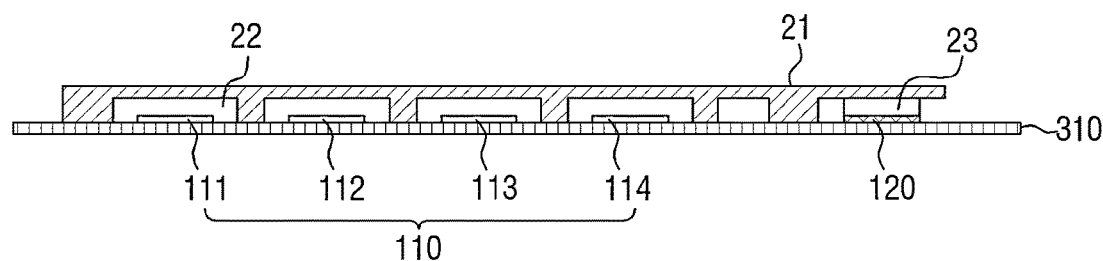
FIGS. 5A and 5B are schematic views illustrating exemplary cooling means included in a substrate of the apparatus of FIG. 1.
Figure 5A:
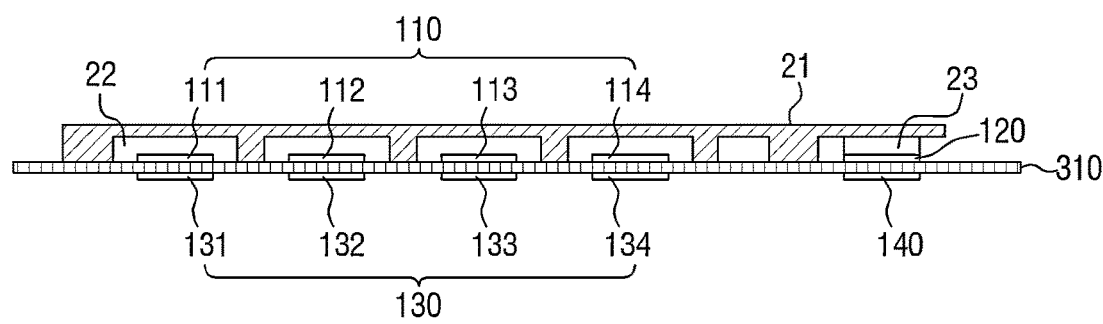
Figure 5B:
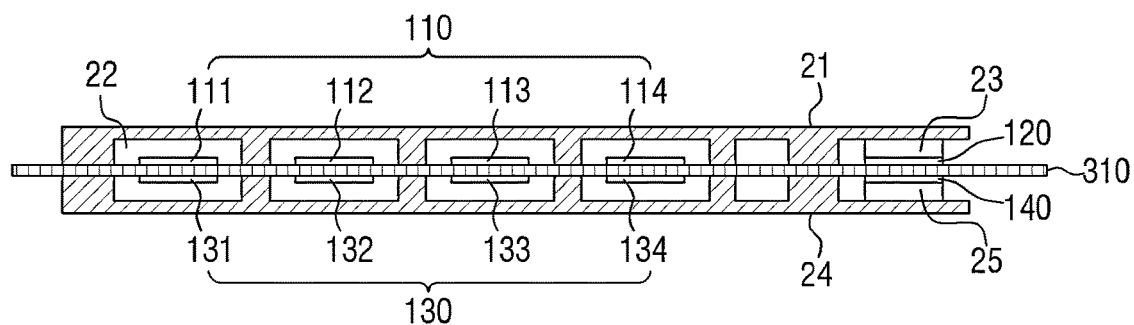

FIGS. 5A and 5B are schematic views illustrating exemplary cooling means included in a substrate of the apparatus of FIG. 1.

The cooling means may include one or more cold plates with protruding parts formed thereon, a heat sheet, a refrigerant, and a plurality of devices.

Specifically, referring to FIG. 5A, a plurality of devices (111, 112, 113, 114, and 120) may be mounted on the first substrate 310 and may be classified, depending on how they are to be cooled, into first devices 111 through 114 that are to be directly cooled and a second device 120 that is to be indirectly cooled.

First cooling means included in the first substrate 310 may include a refrigerant 22, which cools the first devices 111 through 114, a first cold plate 21, which includes contact parts that are in contact with the first substrate 310 to seal the refrigerant 22 and protruding parts that are not in contact with the first substrate 310, and a first heat sheet 23, which is disposed between the second device 120 and the protruding parts of the first cold plate 21.

Heat released from the first devices 111 through 114 may be transmitted to the refrigerant 22 such that the first devices 111 through 114 may be directly cooled, and heat released from the second device 120 may be transmitted to the first cold plate 210 via the first heat sheet 23 such that the second device 120 may be indirectly cooled.

Referring again to FIG. 5A, third devices 131 through 134 and a fourth device 140 may be further mounted on the first substrate 310, on the opposite side of the first devices 111 through 114 and the second device 120. The third devices 131 through 134 and the fourth device 140 may all be air-cooled, and the third devices 131 through 134 may be better cooled than the fourth device 140.

Accordingly, the amount of heat released from the first devices 111 through 114 may differ from the amount of heat released from the second device 120 with respect to the first substrate 310.

Referring to FIG. 5B, the first cooling means included in the first substrate 310 may further include a second cold plate 24, which includes contact parts that are in contact with the first substrate 310 to seal the refrigerant 22 and protruding parts that are not in contact with the first substrate 310, and a second heat sheet 25, which is disposed between the fourth device 140 and the protruding parts of the second cold plate 24.

Heat released from the third devices 131 through 134 may be transmitted to the refrigerant 22 such that the third devices 131 through 134 may be directly cooled, and heat released from the fourth device 140 may be transmitted to the second cold plate 24 via the second heat sheet 25 such that the fourth device 140 may be indirectly cooled.

Accordingly, the amount of heat released from the first devices 111 through 114, the amount of heat released from the second device 120, the amount of heat released from the third devices 131 through 134, and the amount of heat released from the fourth device 140 may all differ from one another with respect to the first substrate 310.

FIGS. 5A and 5B illustrate exemplary cooling means that can be included in the first substrate 310 of FIG. 4, but the present disclosure is not limited thereto. That is, for example, the first cold plate 23 may not include protruding parts, and the first substrate 310 may have a stack structure.

Figure 6:
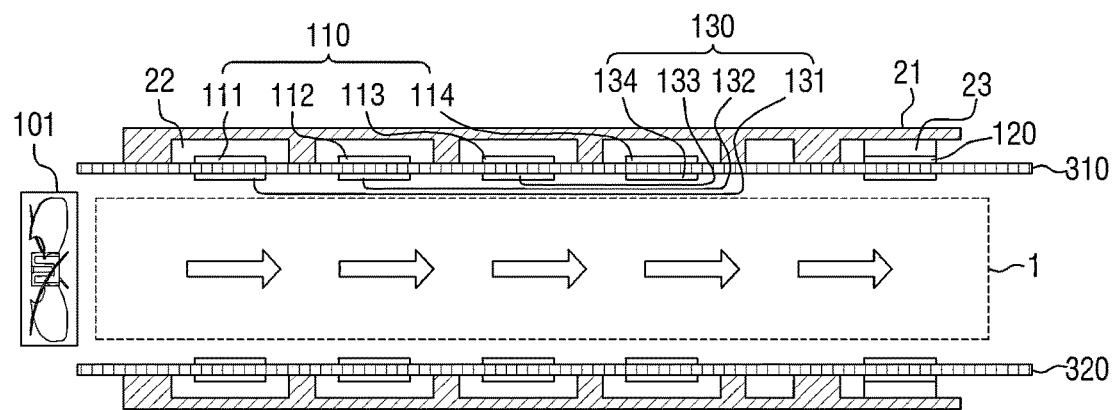
FIG. 6 is a schematic view illustrating how the apparatus of FIG. 1 generates an air flow in heat accumulation space between substrates using a fan.

FIG. 6 is a schematic view illustrating how the apparatus of FIG. 1 generates an air flow in heat accumulation space between substrates using a fan.

Specifically, FIG. 6 illustrates in further detail how the apparatus 10 of FIGS. 4, 5A, and 5B can generate an air flow in heat accumulation space between substrates using the first fan 101, and the apparatus 10 of FIG. 6 will be apparent from the above description of the apparatus of FIGS. 4, 5A, and 5B.

Figure 7:
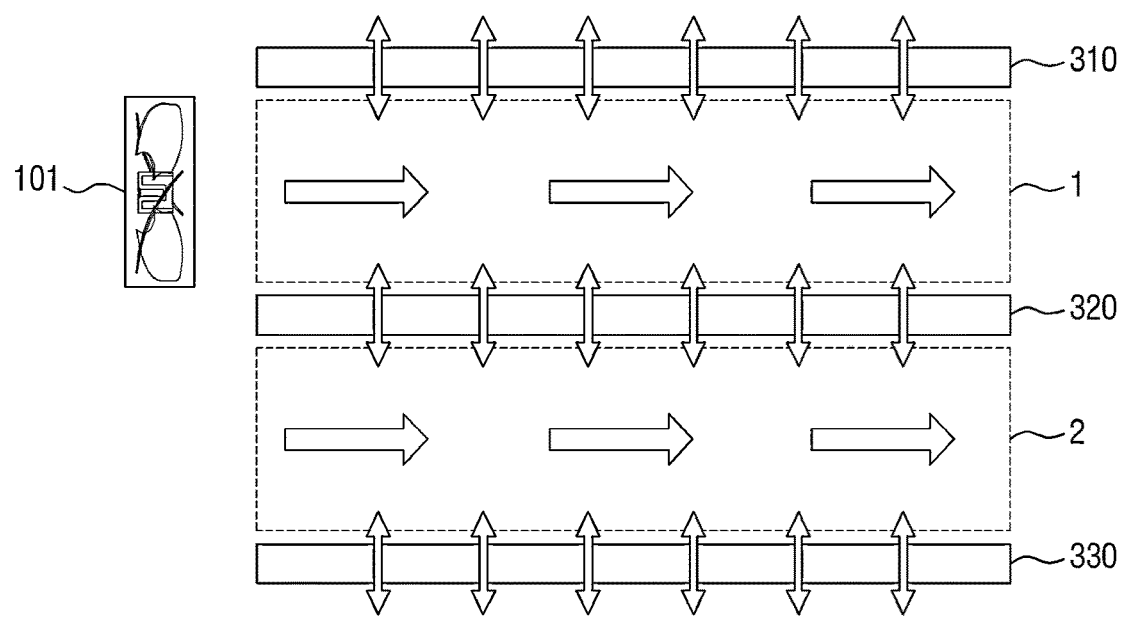
FIG. 7 is a schematic view illustrating an exemplary location of a fan when there are multiple heat accumulation spaces between substrates in the apparatus of FIG. 1.

FIG. 7 is a schematic view illustrating an exemplary location of a fan when there are multiple heat accumulation spaces between substrates in the apparatus of FIG. 1.

Referring to FIG. 7, the apparatus 10 may include first and second substrates 310 and 320 and may further include a third substrate 330, which is disposed on the opposite side of the second substrate 320 from the first substrate 310. Space where heat released from devices mounted on each of the first and second substrates 310 and 320 accumulates will hereinafter be referred to as first heat accumulation space 1, and space where heat released from devices mounted on each of the second and third substrates 320 and 330 accumulates will hereinafter be referred to as second heat accumulation space 2.

When there are multiple heat accumulation spaces, i.e., the first and second heat accumulation spaces 1 and 2, a determination may need to be made as to whether to place the first fan 101 in the first heat accumulation space 1 or in the second heat accumulation space 2 to prevent accumulation of heat in the first heat accumulation space 1 or in the second heat accumulation space 2. Exemplary locations of the first fan 101 in the apparatus 10 will hereinafter be described.

For example, the number of devices disposed in the first heat accumulation space 1 may be compared with the number of devices disposed in the second heat accumulation space 2, and the first fan 101 may be arranged in whichever of the first and second heat accumulation spaces 1 and 2 has more devices than the other heat accumulation space.

In another example, the temperature of the first heat accumulation space 1, measured by a first temperature sensor (not illustrated), may be compared with the temperature of the second heat accumulation space 2, measured by a second temperature sensor (not illustrated), and the first fan 101 may be arranged in whichever of the first and second heat accumulation spaces 1 and 2 has a higher temperature than the other heat accumulation space.

Devices disposed in heat accumulation space may be classified into devices that are to be directly cooled, devices that are to be indirectly cooled, and devices that are to be air-cooled, and the amount of heat released into the heat accumulation space may be greater in the order of the devices that are to be air-cooled, the devices that are to be indirectly cooled, and the devices that are to be directly cooled. Thus, the number of devices currently being air-cooled in the first heat accumulation space 1 may be compared with the number of devices currently being air-cooled in the second heat accumulation space 2, and the first fan 101 may be arranged in whichever of the first and second heat accumulation spaces 1 and 2 has more devices currently being air-cooled than the other heat accumulation space.

However, the location of the first fan 101 is not limited to these examples.

Figure 8:
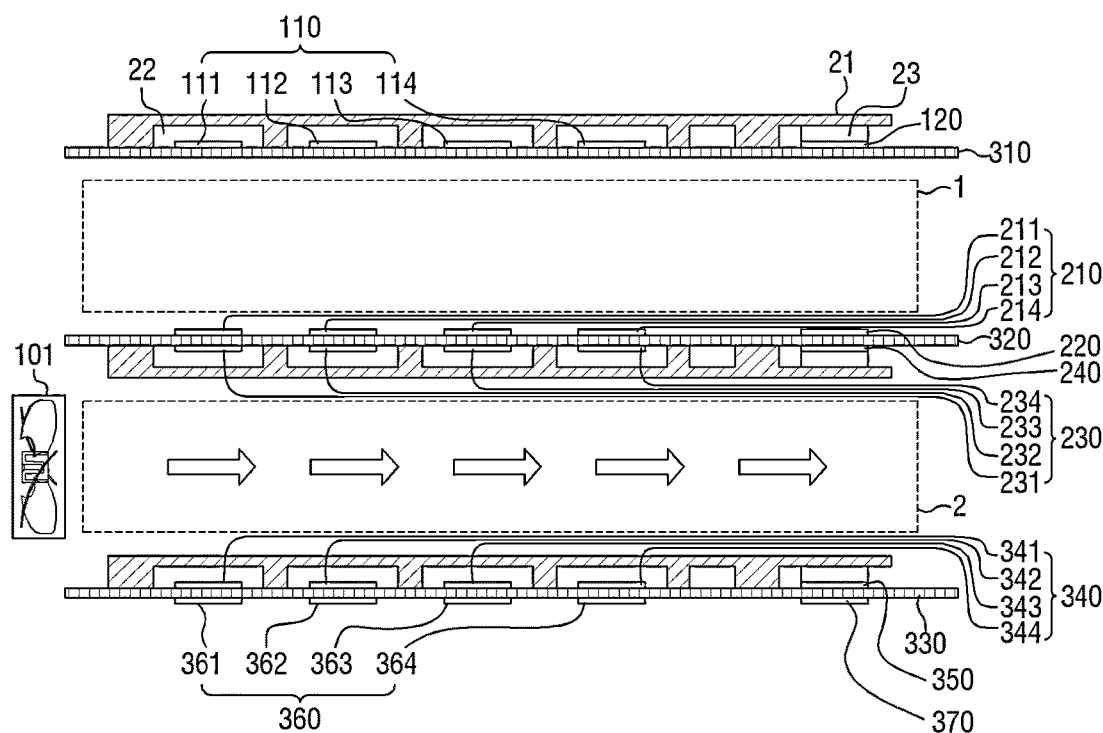
FIGS. 8 and 9 are schematic views illustrating other exemplary locations of a fan when there are multiple heat accumulation spaces between substrates in the apparatus of FIG. 1.
Figure 9:
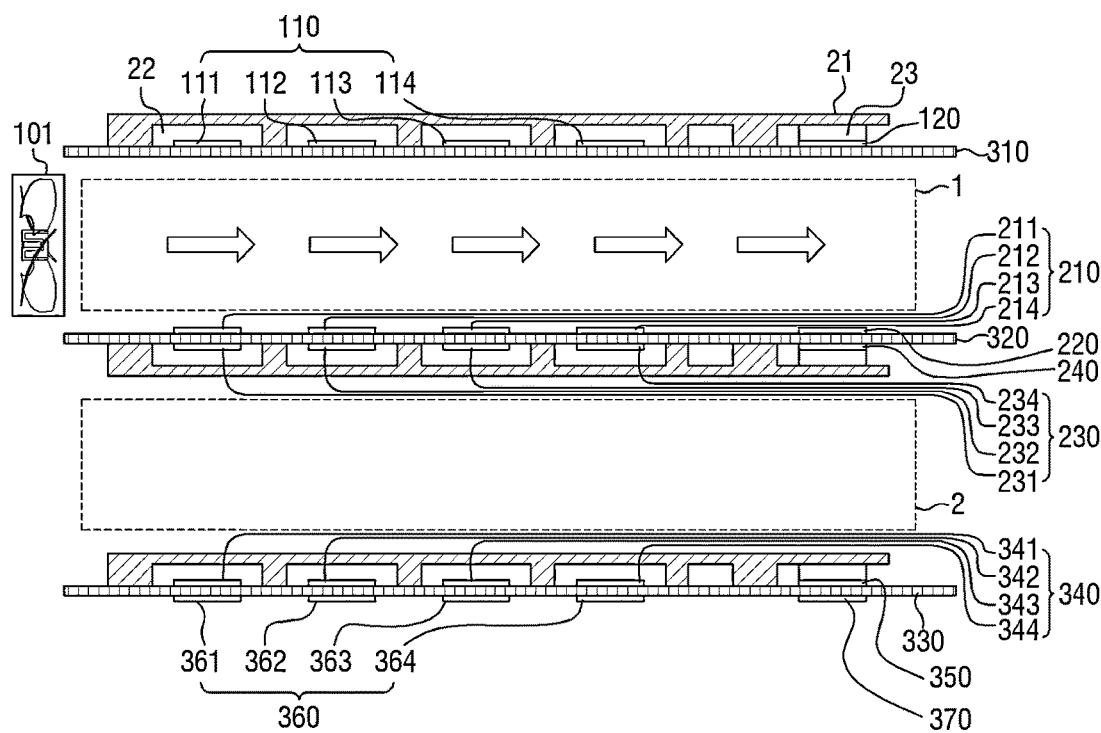

FIGS. 8 and 9 are schematic views illustrating other exemplary locations of a fan when there are multiple heat accumulation spaces between substrates in the apparatus of FIG. 1.

Referring to FIG. 8, devices (211, 212, 213, 214, and 220), which are mounted on a second substrate 320, may be disposed in first heat accumulation space 1, and devices (231, 232, 233, 234, and 240), which are mounted on the second substrate 320, and devices (311, 312, 313, 314, and 320), which are mounted on a third substrate 330, may be disposed in second heat accumulation space 2.

As the number of devices disposed in the second heat accumulation space 2 is greater than the number of devices disposed in the first heat accumulation space 1, a determination may be made that a larger amount of heat has accumulated in the second heat accumulation space 2 than in the first heat accumulation space 1. Accordingly, the first fan 101 may be arranged between the second and third substrates 320 and 330 and may generate an air flow in the second heat accumulation space 2.

Referring to FIG. 9, devices (131, 132, 133, 134, and 140), which are mounted on a first substrate 310, and devices (211, 212, 213, 214, and 220), which are mounted on a second substrate 320, may be disposed in first heat accumulation space 1, and devices (311, 312, 313, 314, and 320), which are mounted on a third substrate 330, may be disposed in second heat accumulation space 2. The devices disposed in the first heat accumulation space 1 may all be devices to be air-cooled, and the devices disposed in the second heat accumulation space 2 may be devices to be directly or indirectly cooled.

That is, as the number of devices currently being air-cooled in the first heat accumulation space 1 is greater than the number of devices currently being air-cooled in the second heat accumulation space 2, a determination may be made that a larger amount of heat has accumulated in the first heat accumulation space 1 than in the second heat accumulation space 2. Accordingly, the first fan 101 may be arranged between the first and second substrates 310 and 320 and may generate an air flow in the first heat accumulation space 1.

Meanwhile, as different amounts of heat may be generated by different devices mounted on each substrate, the number of devices disposed in heat accumulation space or the number of devices currently being air-cooled in the heat accumulation space may not necessarily be proportional to the temperature in the heat accumulation space. In this case, although not specifically illustrated in FIGS. 8 and 9, the temperature of the first heat accumulation space 1, measured by a first temperature sensor (not illustrated), may be compared with the temperature of the second heat accumulation space 2, measured by a second temperature sensor (not illustrated). Then, if a determination is made that the temperature of the first heat accumulation space 1 is higher than the temperature of the second heat accumulation space 2, the first fan 101 may be arranged between the first and second substrates 310 and 320 and may generate an air flow in the first heat accumulation space 1.

Figure 10:
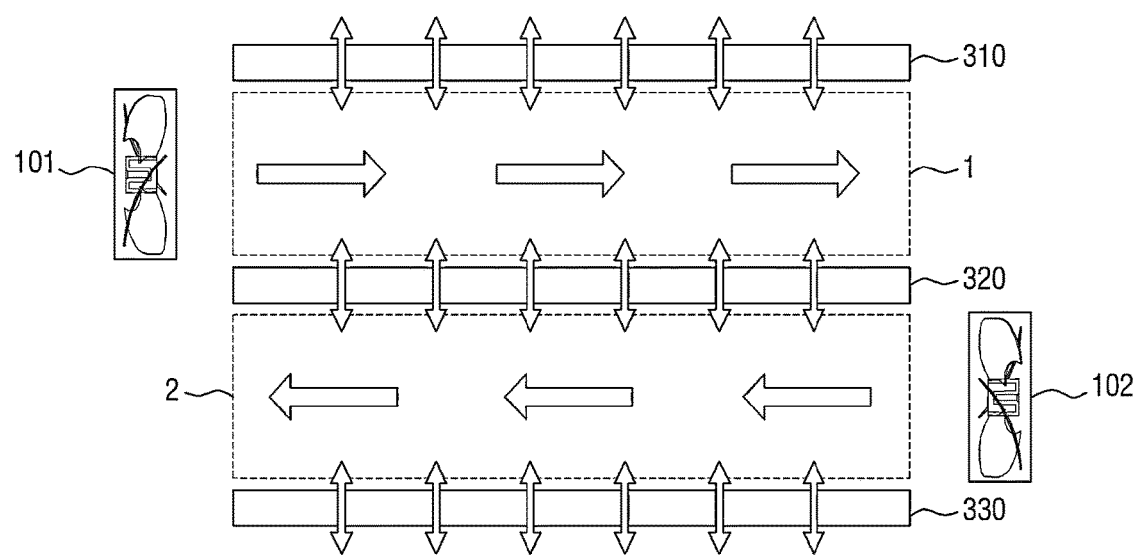
FIG. 10 is a schematic view of an apparatus generating air flows in opposite directions in multiple heat accumulation spaces between substrates using multiple fans.

FIG. 10 is a schematic view of an apparatus generating air flows in opposite directions in multiple heat accumulation spaces between substrates using multiple fans. Although not specifically illustrated in FIG. 10, multiple devices may be mounted on each of first, second, and third substrates 310, 320, and 330 and may be cooled by first, second, and third cooling means.

The apparatus 10 of FIG. 10 may further include the third substrate 330 and a second fan 102 in addition to the elements illustrated in FIG. 4. The third substrate 330 may be disposed on the opposite side of the second substrate 320 from the first substrate 310, and the second and third substrates 320 and 330 may be spaced apart from each other and may be arranged in parallel with each other. The second and third substrates 320 and 330 may be arranged substantially in parallel with each other such that the second and third substrates 320 and 330 may form an angle less than a predefined reference level therebetween. The third substrate 330 may be provided with third cooling means using a refrigerant that can be circulated with the outside. Space where heat released from the devices mounted on each of the second and third substrates 320 and 330 accumulates will hereinafter be referred to as second heat accumulation space 2.

The second fan 102 may generate a second air flow in the second heat accumulation space 2 in a direction parallel to the second and third substrates 320 and 330, but opposite to that of a first air flow generated in first heat accumulation space 1. The direction of the second air flow may be substantially parallel to the second and third substrates 320 and 330 so that the angles between the second air flow and the second and third substrates 320 and 330 may be less the predefined reference level. Alternatively, the direction of the second air flow may be substantially parallel to the second and third substrates 320 and 330 so that the sum of the angles between the second air flow and the second and third substrates 320 and 330 may be less than the predefined reference level.

The third cooling means of the third substrate 330 is similar to the first and second cooling means described above with reference to FIG. 4, and thus, a detailed description thereof will be omitted not to obscure the gist of the present disclosure.

A structure capable of the air in the apparatus 10 using the first and second air flows, which are generated in opposite directions, will hereinafter be described.

The apparatus 10 of FIG. 10 may further include the temperature sensor 400, which measures the temperature in the apparatus 10 at intervals of a predetermined amount of time, and the second air flow controller 200, which automatically controls the angle of the second fan 102 if a temperature measurement provided by the temperature sensor 400 is not within a valid temperature range determined in advance.

The second air flow controller 200 may include the second fan tilt control motor 203, which provides power for primarily controlling the angle of the second fan 102, and the second air flap 204, which is disposed between the second fan 102 and the second heat accumulation space 2 and secondarily controls the second air flow generated by the second fan 102.

In other words, the temperature in the apparatus 10 may be measured by the temperature sensor 400, and if the measured temperature is not within the valid temperature range, the second air flow controller 200 may improve cooling efficiency by automatically controlling the angle of the second fan 102 such that the temperature in the apparatus 10 falls within the valid temperature range. The greater the difference between the measured temperature and the valid temperature range, the greater the amount by which the second air flow controller 200 controls the angle of the second fan 102.

Specifically, the direction of an air flow generated in the second heat accumulation space 2 may be controlled by primarily controlling the angle of the second fan 102 with power provided by the second fan tilt control motor 203 and secondarily controlling the installation angle of the second air flap 204 with another power, but the present disclosure is not limited thereto. Here, the direction of an internal circulation air flow may be controlled using only the first fan tilt control motor 103 and the first air flap 104 of the first air flow controller 100, using only the second fan tilt control motor 203 and the second air flap 204 of the second air flow controller 200, or using not only the first fan tilt control motor 103 and the first air flap 104 of the first air flow controller 100, but also the second fan tilt control motor 203 and the second air flap 204 of the second air flow controller 200.

In other words, it is not particularly limited with which element of the apparatus 10 (and in what sequence) to control the direction of an air flow. For example, the first air flow controller 100 may control the direction of an internal circulation air flow by controlling the direction of the first air flow using the first fan tilt control motor 103, the first air flap 104, or both at the same time.

The first and second air flaps 104 and 204 of the first and second air flow controllers 100 and 200 are simply for controlling the first and second air flows to be circulated within the apparatus 10, and a structure for providing an optimal cooling efficiency via an internal circulation air flow using the first and second air flows may be further provided in the apparatus 10.

The first and second air flow controllers 100 and 200 may control not only the direction of an air flow, but also the intensity of an air flow. For example, if the temperature in the apparatus 10, measured by the temperature sensor 400, exceeds the maximum of the valid temperature range, the first and second air flow controllers 100 and 200 may reduce the speed of the first and second fans 101 and 102, respectively, and if the temperature in the apparatus 10, measured by the temperature sensor 400, is less than the minimum of the valid temperature range, the first and second air flow controllers 100 and 200 may increase the speed of the first and second fans 101 and 102, respectively.

In short, the apparatus 10 can prevent accumulation of heat in the first and second heat accumulation spaces 1 and 2 by circulating the air using the first and second air flows, which are generated by the first and second fans 101 and 102, respectively, and can improve the cooling efficiency for the devices mounted on each of the first, second, and third substrates 310, 320, and 330.

Figure 11:
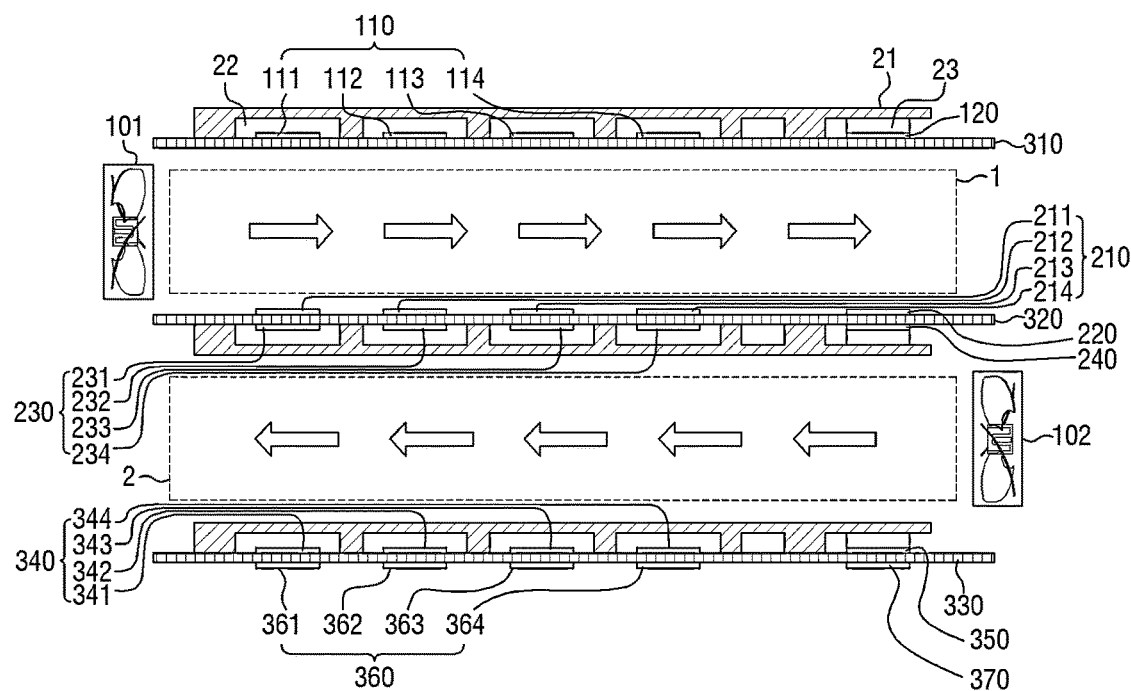
FIG. 11 is a schematic view illustrating how the apparatus of FIG. 1 generates air flows in opposite directions in multiple heat accumulation spaces between substrates using multiple fans.

FIG. 11 is a schematic view illustrating how the apparatus of FIG. 1 generates air flows in opposite directions in multiple heat accumulation spaces between substrates using multiple fans.

Specifically, FIG. 11 illustrates in further detail how the apparatus 10 of FIG. 10 can generate air flows in multiple heat accumulation spaces between substrates using the first and second fans 101 and 102, and the apparatus of FIG. 11 will be apparent from the above description of the apparatus of FIG. 10.

Figure 12:
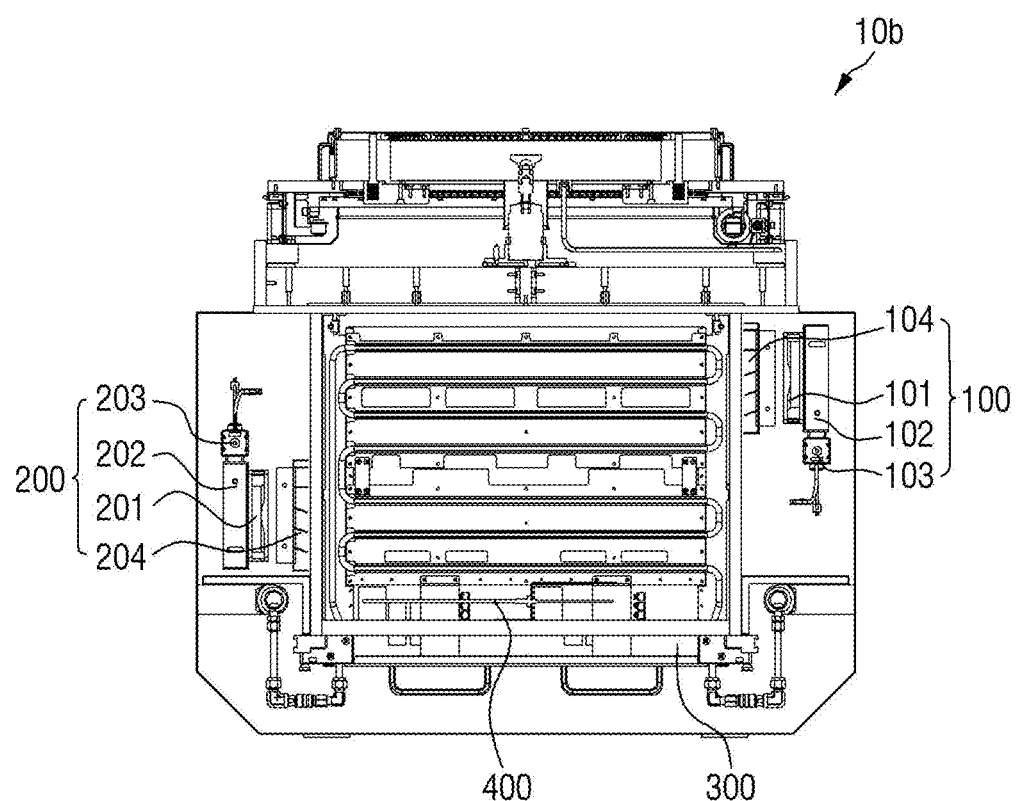
FIG. 12 is a schematic view of an apparatus according to an embodiment of the present disclosure, which is a test head of a wafer test apparatus according to an embodiment of the present disclosure.
Figure 12:
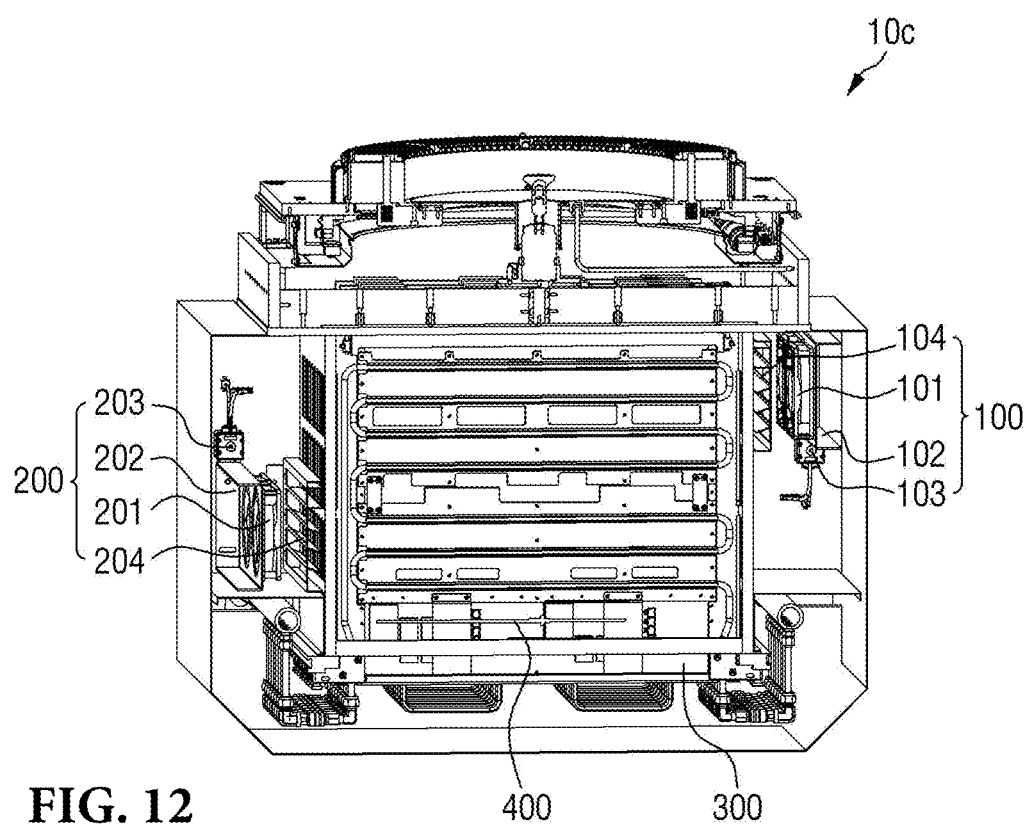

FIG. 12 illustrates schematic views of an apparatus according to an embodiment of the present disclosure, which is a test head of a wafer test apparatus according to an embodiment of the present disclosure. However, the present disclosure is not limited to the apparatus of FIG. 12, and may encompass various types of apparatuses equipped with a closed space therein.

Specifically, the apparatus of FIG. 12 may be the apparatus of FIGS. 2 through 11, as viewed from different angles and thus will be apparent from the above description of the apparatus of FIGS. 2 through 11.

Figure 13:
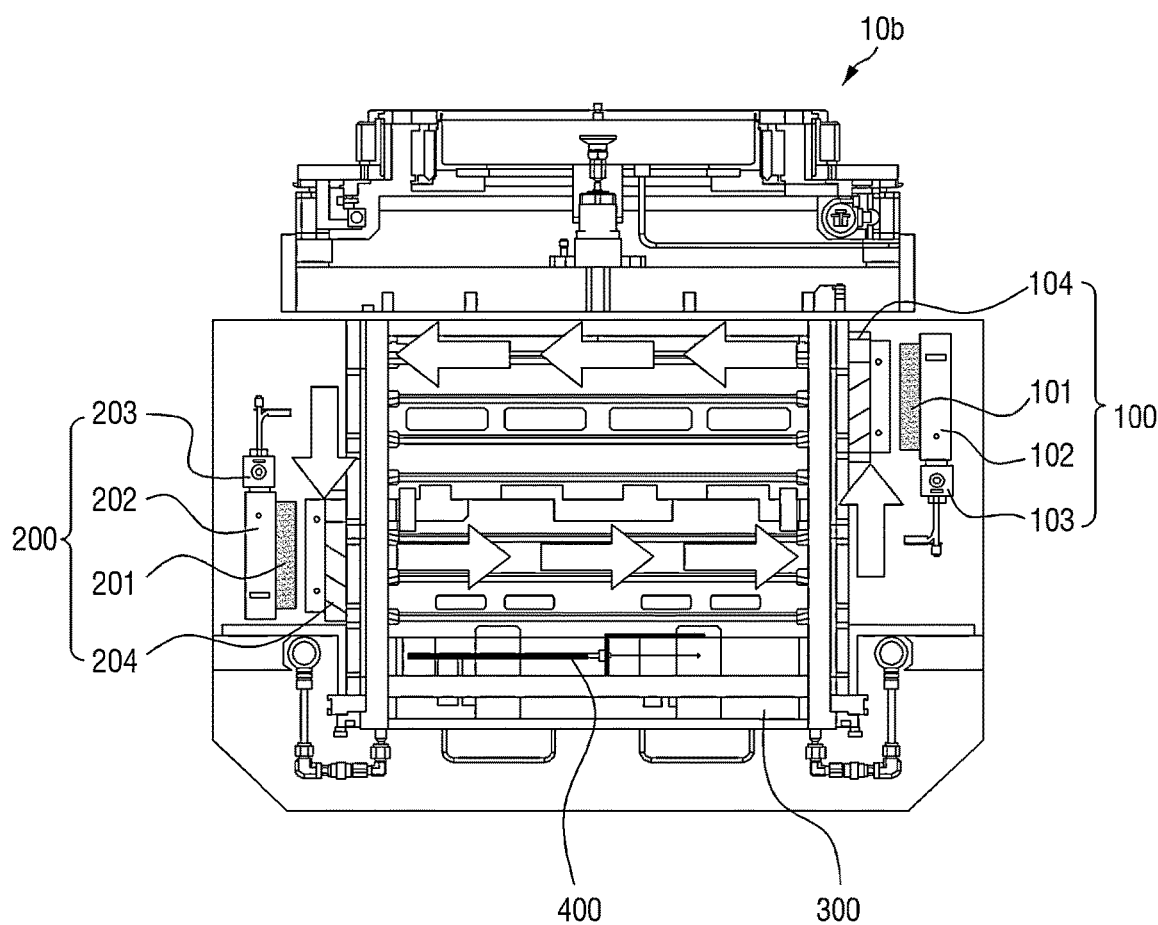
FIG. 13 is a schematic view illustrating air flows circulating in an apparatus according to an embodiment of the present disclosure, which is a test head of a wafer test apparatus according to an embodiment of the present disclosure.

FIG. 13 is a schematic view illustrating air flows circulating in an apparatus according to an embodiment of the present disclosure, which is a test head of a wafer test apparatus according to an embodiment of the present disclosure.

Specifically, FIG. 13 illustrates air flows circulating in the apparatus of FIGS. 10 and 11, and thus, the embodiment of FIG. 13 will be apparent from the above description of the embodiments of FIGS. 10 and 11.

A cooling method (and/or operation) using an internal circulation air flow may be realized by an apparatus including a plurality of substrates, a plurality of fans, and a housing of a closed structure.

The cooling method may include: providing, by a first substrate, which is one of the substrates included in the apparatus, first cooling means using a refrigerant that can be circulated with the outside; forming first heat accumulation space between the first substrate and a second substrate, which is disposed to be in parallel with, and apart from, the first substrate, and providing, by the second substrate, second cooling means using a refrigerant that can be circulated with the outside; and generating, by a first fan, which is one of the fans included in the apparatus, a first air flow in the first heat accumulation space in a direction parallel to the first and second substrates.

A first air flow controller of the apparatus may be disposed between the first fan and the first heat accumulation space and may thus be able to secondarily control the first flow.

In some embodiments, the cooling method may further include: forming second heat accumulation space between the second substrate and a third substrate by arranging the third substrate to be in parallel with, and apart from, the second substrate, and providing third cooling means using a refrigerant that can be circulated with the outside.

The cooling method may further include: generating, by a second fan, which is another one of the fans included in the apparatus, a second air flow in the second heat accumulation space in a direction parallel to the second and third substrates and in an opposite direction to that of the first air flow, wherein a second air flow controller of the apparatus may be disposed between the second fan and the second heat accumulation space and may thus be able to secondarily control the second air flow.

Embodiments of the present disclosure and the effects thereof have been described above with reference to FIGS. 1 through 13. However, it should be noted that the effects of the present disclosure are not limited to those described above, and other effects of the present disclosure will be apparent from the following description.

Embodiments of the present disclosure have been described above with reference to the accompanying drawings, but the present disclosure is not limited thereto and may be implemented in various different forms. It will be understood that the present disclosure can be implemented in other specific forms without changing the technical spirit or gist of the present disclosure. Therefore, it should be understood that the embodiments set forth herein are illustrative in all respects and not limiting.

What is claimed is:

1. An apparatus comprising:
a first substrate including first cooling means using a refrigerant that is circulated with an outside;
a second substrate disposed to be in parallel with, and apart from, the first substrate and thus to form first heat accumulation space between the first and second substrates, the second substrate including second cooling means using a refrigerant that is circulated with the outside;
a first fan generating a first air flow in the first heat accumulation space in a direction parallel to the first and second substrates;
a housing of a closed structure;
a temperature sensor measuring the temperature in the apparatus at intervals of a predetermined amount of time; and
a first air flow controller automatically controlling an angle of the first fan in response to the temperature measured by the temperature sensor being outside of a predefined valid temperature range,
wherein the first air flow controller includes
a first fan tilt control motor configured to provide power for primarily controlling the angle of the first fan, and
a first air flap disposed between the first fan and the first heat accumulation space, the first air flap configured to secondarily control the first air flow generated by the first fan.

2. The apparatus of claim 1, further comprising:
a third substrate arranged to be in parallel with, and apart from, the second substrate and thus to form second heat accumulation space between the second and third substrates, the third substrate including third cooling means using the refrigerant that is circulated with the outside,
wherein a number of devices positioned in the first heat accumulation space is greater than a number of devices positioned in the second heat accumulation space.

3. The apparatus of claim 1, further comprising:
a third substrate arranged to be in parallel with, and apart from, the second substrate and thus to form second heat accumulation space between the second and third substrates, the third substrate including third cooling means using the refrigerant that is circulated with the outside;
a first temperature sensor measuring the temperature of the first heat accumulation space; and
a second temperature sensor measuring the temperature of the second heat accumulation space,
wherein the temperature measured by the first temperature is higher than the temperature measured by the second temperature sensor.

4. The apparatus of claim 1, further comprising:
a third substrate arranged to be in parallel with, and apart from, the second substrate and thus to form second heat accumulation space between the second and third substrates, the third substrate including third cooling means using the refrigerant that is circulated with the outside; and
a second fan generating a second air flow in the second heat accumulation space in a direction parallel to the second and third substrates and in an opposite direction to that of the first air flow.

5. The apparatus of claim 4, further comprising:
a second air flow controller automatically controlling an angle of the second fan.

6. The apparatus of claim 5, wherein
the second air flow controller includes a second fan tilt control motor configured to provide power for primarily controlling the angle of the second fan, and
a second air flap disposed between the second fan and the second heat accumulation space, the second air flap configured to secondarily control the second air flow generated by the second fan.

7. The apparatus of claim 1, wherein the apparatus is a test head of a wafer test apparatus.

8. A cooling method using an internal circulation air flow, the cooling method performed by an apparatus including substrates, fans, and a housing of a closed structure, the cooling method comprising:
providing, by a first substrate, first cooling means using a refrigerant that is circulated with an outside;
forming first heat accumulation space between the first substrate and a second substrate, which is disposed to be in parallel with, and apart from, the first substrate, and providing, by the second substrate, second cooling means using the refrigerant that is circulated with the outside;

generating, by a first fan, a first air flow in the first heat accumulation space in a direction parallel to the first and second substrates;

measuring, by a temperature sensor, the temperature in the apparatus at intervals of a predetermined amount of time, and automatically controlling, by a first air flow controller, an angle of the first fan if the temperature measured by the temperature sensor is not within a predefined valid temperature range, wherein the first air flow controller includes
- a first fan tilt control motor configured to provide power for primarily controlling the angle of the first fan, and
- a first air flap disposed between the first fan and the first heat accumulation space, the first air flap configured to secondarily control the first air flow generated by the first fan.

9. The cooling method of claim 8, further comprising:

forming second heat accumulation space between the second substrate and a third substrate, which is disposed to be in parallel with, and apart from, the second substrate, and providing, by the third substrate, third cooling means using the refrigerant that is circulated with the outside, wherein a number of devices positioned in the first heat accumulation space is greater than a number of devices positioned in the second heat accumulation space.

10. The cooling method of claim 9, wherein the forming the second heat accumulation space and the providing the third cooling means, comprises measuring, by a first temperature sensor, the temperature of the first heat accumulation space and measuring, by a second temperature sensor, the temperature of the second heat accumulation space, and the temperature measured by the first temperature sensor is higher than the temperature measured by the second temperature sensor.

11. The cooling method of claim 9, wherein the forming the second heat accumulation space and the providing the third cooling means, comprises generating, by a second fan, a second air flow in a direction parallel to the second and third substrates and in an opposite direction to that of the first air flow.

12. The cooling method of claim 11, further comprising:

automatically controlling, by a second air flow controller, an angle of the second fan.

13. The cooling method of claim 12, the second air flow controller includes a second fan tilt control motor, configured to provide power for primarily controlling the angle of the second fan, and a second air flap disposed between the second fan and the second heat accumulation space, the second air flap configured to secondarily control the second air flow generated by the second fan.

14. The cooling method of claim 8, wherein the apparatus is a test head of a wafer test apparatus.

* * * * *